United States Patent [19]

Lorenz et al.

[11] Patent Number: 5,710,400

[45] Date of Patent: Jan. 20, 1998

[54] ROTARY MULTIPLE CAPACITIVE SWITCH

[75] Inventors: Edwin D. Lorenz, Grand Blanc; Stephen W. Smith, South Lyon, both of Mich.

[73] Assignee: Eaton Corporation, Cleveland, Ohio

[21] Appl. No.: 606,129

[22] Filed: Feb. 23, 1996

[51] Int. Cl.[6] .................................................... H01H 9/00
[52] U.S. Cl. .................................... 200/61.54; 200/600
[58] Field of Search .......................... 200/61.27–61.38, 200/61.54–61.57, 600; 361/287, 288

[56] References Cited

U.S. PATENT DOCUMENTS

| | | | |
|---|---|---|---|
| 4,131,772 | 12/1978 | Weckenmann et al. | 200/61.54 |
| 4,219,709 | 8/1980 | Scarbro | 200/61.54 |
| 4,518,836 | 5/1985 | Woolridge | 200/61.54 |
| 4,900,946 | 2/1990 | Williams et al. | 307/10.1 |
| 5,049,706 | 9/1991 | Du Rocher | 200/61.54 |
| 5,130,507 | 7/1992 | Zuercher | 200/600 |
| 5,453,588 | 9/1995 | Du Rocher et al. | 200/61.54 |

*Primary Examiner*—J. R. Scott
*Attorney, Agent, or Firm*—Roger A. Johnston

[57] ABSTRACT

A stalk operated switch assembly having a stalk or lever end-mounted on a housing includes a button on the free end which is user rotatable for effecting rotation of a cam within the housing. The housing includes a plurality of capacitive switches aligned thereon. Each switch is made by applying alternate layers of conductive and dielectric ink and curing to form individual pairs of spaced capacitive plates. A conductive elastomer pad is disposed over each pair of plates and compressed against the plates by an individual actuator for each pad. The individual actuators are moved by one of plural concentric cam tracks formed on the rotor. The stalk type rotary multiple capacitive switching assembly has application for automotive windshield wiper delay circuit control.

10 Claims, 4 Drawing Sheets

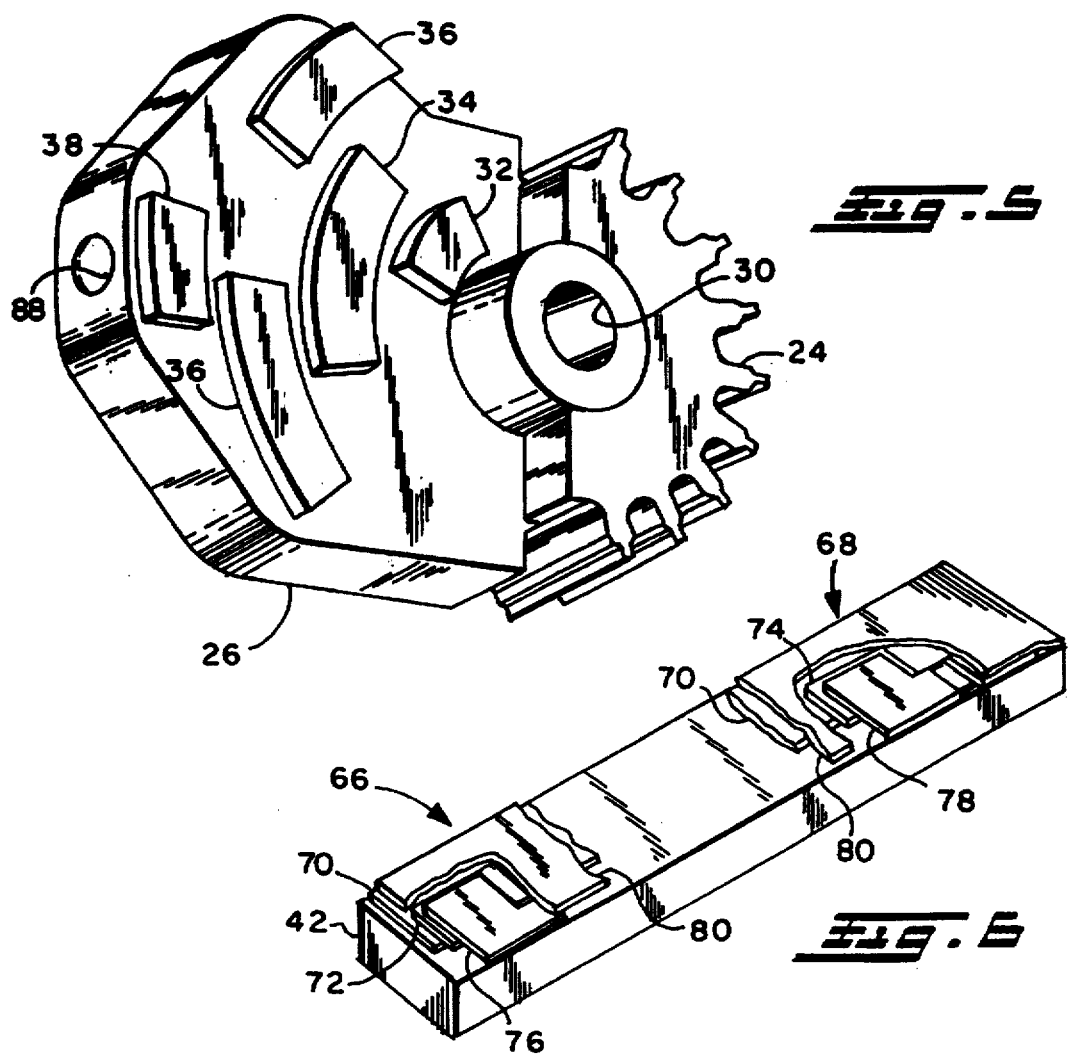
_FIG. 5_
_FIG. 6_
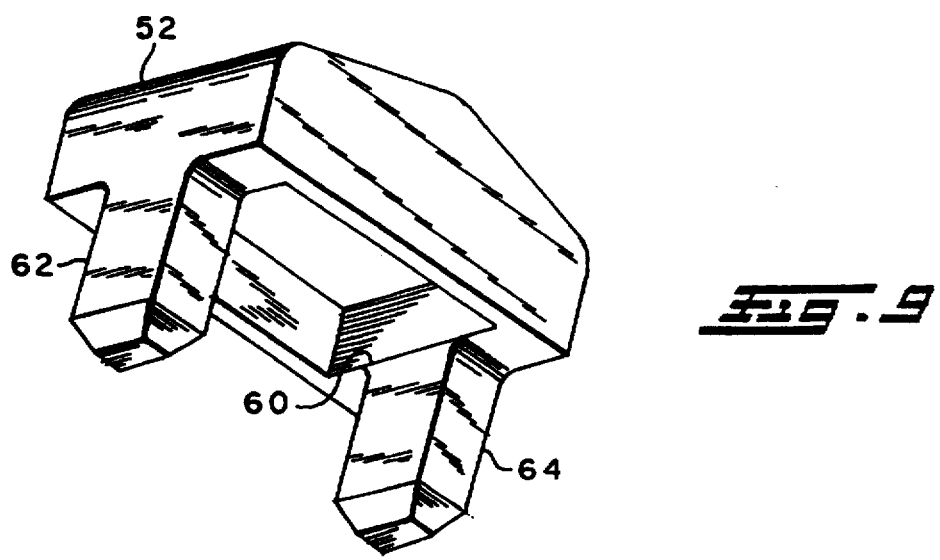
_FIG. 9_

ROTARY MULTIPLE CAPACITIVE SWITCH

BACKGROUND OF THE INVENTION

The present invention relates to switches of the type having a rotary actuator and particularly switches of the type having the rotary actuator forming part of a stalk or pivoted lever wherein the user can move the lever about at least one axis for certain switching functions and rotate the actuator about an axis normal to the first axis for performing additional or other switching functions. Switches of this type are often referred to as stalk switches and are commonly employed in motor vehicle applications for switches mounted on the steering column for providing control of various vehicle accessories. Stalk switches are commonly employed in passenger automobiles for control of cruise control, windshield wiper and headlamp switches with the stalks mounted on the sides of the steering column adjacent the steering wheel.

Heretofore, switches for controlling automotive accessories have been required to handle the switching of the full current for the accessory which, in the case of a windshield wiper motor, requires the handling of a substantial current, on the order of 20 amperes for motor starting. This requirement for handling heavy current has resulted in the switches being quite robust and manufactured with relatively heavy bus bars and noble metal contacts in the switching mechanism. This has resulted in a relatively costly switch for each accessory function to be controlled.

With the advent of solid state electronics, and particularly microprocessors, it has been found desirable to utilize on-board microprocessors for vehicle electrical controls which has enabled multiplexing of the vehicle accessory control circuitry and an attendant reduction in the amount of wiring. When vehicle accessory control circuitry is multiplexed, the individual user control switches need handle only a fractional ampere signal current to the microprocessor which can enable relays for handling the load current, and, thus the requirement for heavy current handling components in the user control switches for automotive accessories can been eliminated.

It has thus been desired to provide lower cost low current switches for automotive user control switches for automotive accessories and to incorporate such switches into existing automotive accessory user control arrangements. It has particularly been desired to incorporate low cost low current switching in stalk controls of the type utilized for driver control of windshield wipers and cruise controls in passenger automobiles.

SUMMARY OF THE INVENTION

The present invention relates to low current switching particularly in low voltage applications such as encountered in automotive accessory controls and particularly relates to incorporating such switches in user control arrangements in stalk mounted switches employed in automotive vehicles. The stalk switch of the present invention has the lever or stalk pivoted at one end about an axis for effecting certain switch actuating functions, as for example a group of slide switches. A user-contactable portion of the stalk is rotatable about an axis normal to the end pivot axis. The rotatable portion of the stalk engages a cam which upon rotation sequentially actuates a separate plurality of low current capacitive switches formed on a substrate mounted on a housing. The cam in the presently preferred practice has a plurality of spaced concentric cam tracks each of which is disposed to actuate one of the plurality of capacitive switches which are preferably arranged in spaced aligned arrangement on the housing. Each of the capacitive switches has a pair of spaced conductive plates formed by alternately inking conductive and non-conductive material on a substrate. Each switch has a actuator guided for sliding movement generally at right angles to the housing. A conductive elastomeric member is compressed between the actuator and the substrate to effect a change in the capacitance across the plates which is sufficient that it may be electrically detectable by external circuitry as a switching function.

The stalk mounted switch of the present invention has particular application in automotive windshield wiper delay circuit control where a discrete sequence of switching is desired for input to a microprocessor on board the vehicle for controlling the wiper motor current and delay.

BRIEF DESCRIPTION OF THE DRAWINGS

FIG. 5 is a view of the cam of the embodiment of FIG. 1 taken along lines 5—5 of FIG. 4;

FIG. 6 is an axonometric view of the capacitive switching substrate for the switches of the present invention;

DETAILED DESCRIPTION

Figure 1:
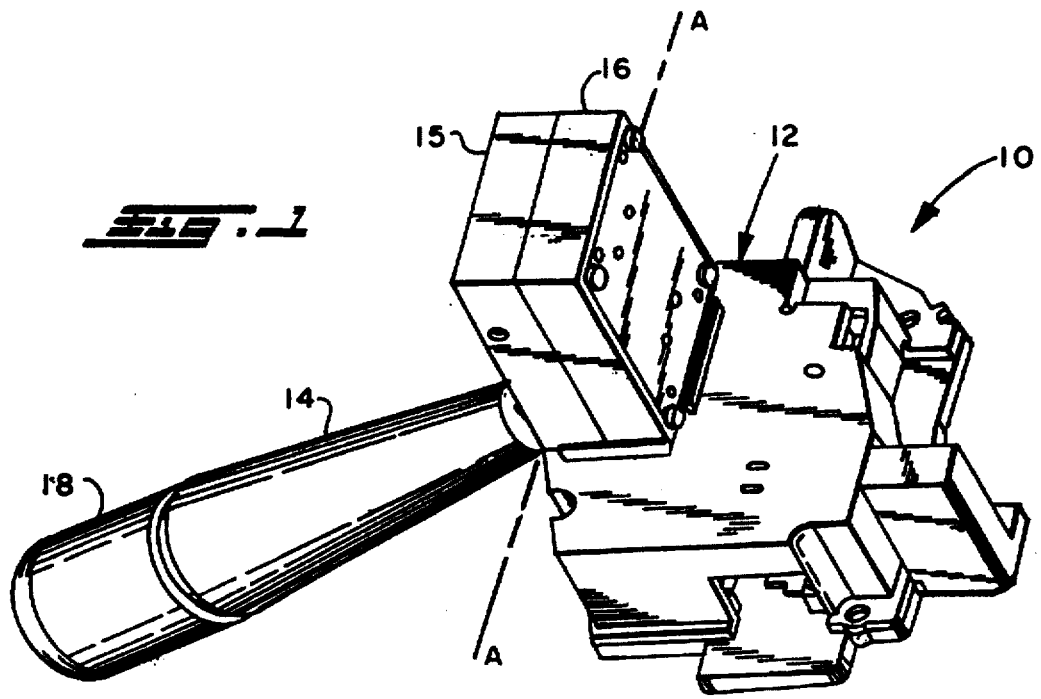
FIG. 1 is an axonometric view of the present invention employed as a windshield wiper stalk mounted switching assembly.
Figure 2:
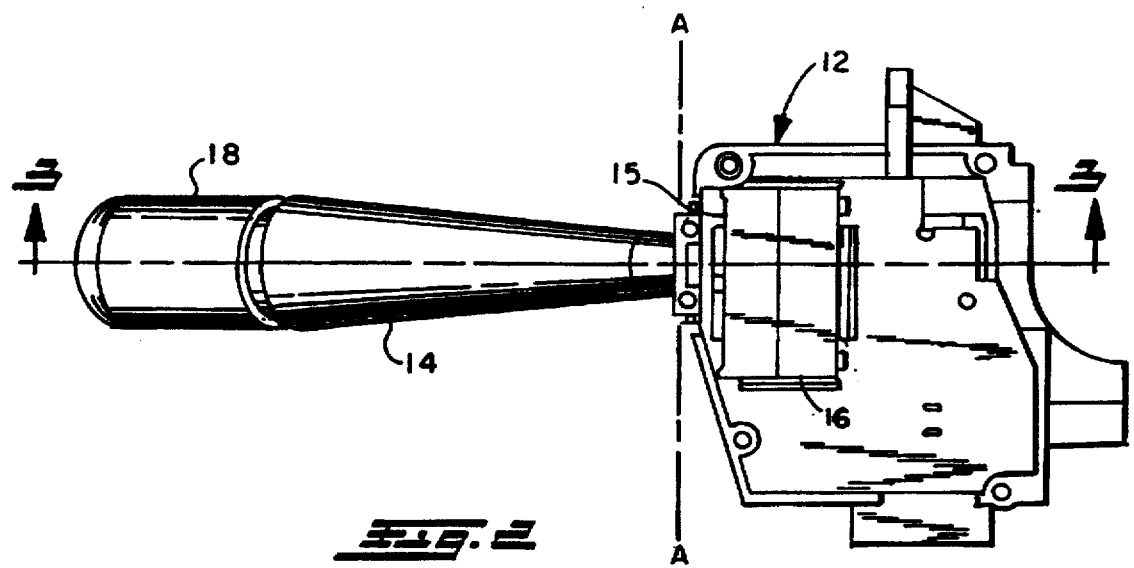
FIG. 2 is a top view of the assembly of FIG. 1.

Referring to FIGS. 1 and 2, the switch assembly of the present invention is indicated generally at 10 and includes a switch housing means 12 which includes auxiliary casing portions 15, 16 and having a stalk or lever 14 extending therefrom. Stalk 14 is pivoted at an end thereof on the housing for movement about at least one axis indicated by reference characters A—A. The movement about axis A—A is operable for effecting actuation of a group of slide switches (not shown). Stalk 14 has a portion 16 thereof preferably adjacent the end remote from the housing which portion is rotatable about an axis generally normal to the axis A—A or an axis extending along the length of the stalk 14. The rotatable portion comprises an end button 18 is attached to a shaft 20 extending through the center of the stalk 14, which shaft has a gear 22 attached to the end thereof within housing 12.

Figure 3:
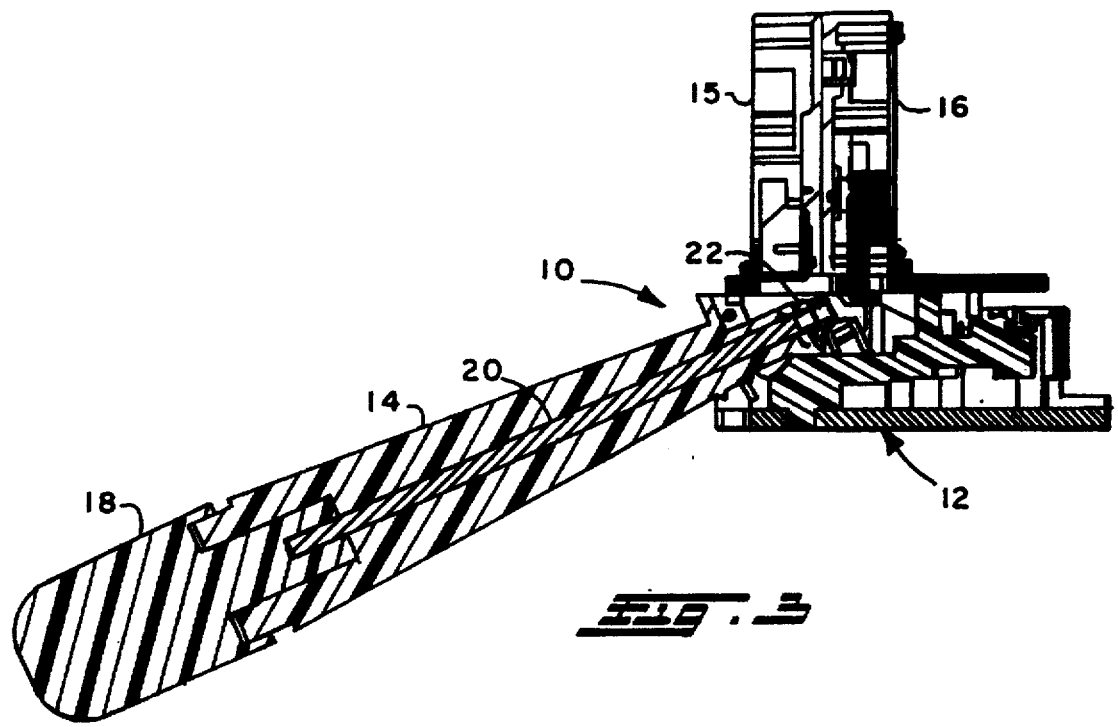
FIG. 3 is a section view taken along section indicating lines 3—3 of FIG. 2.
Figure 4:
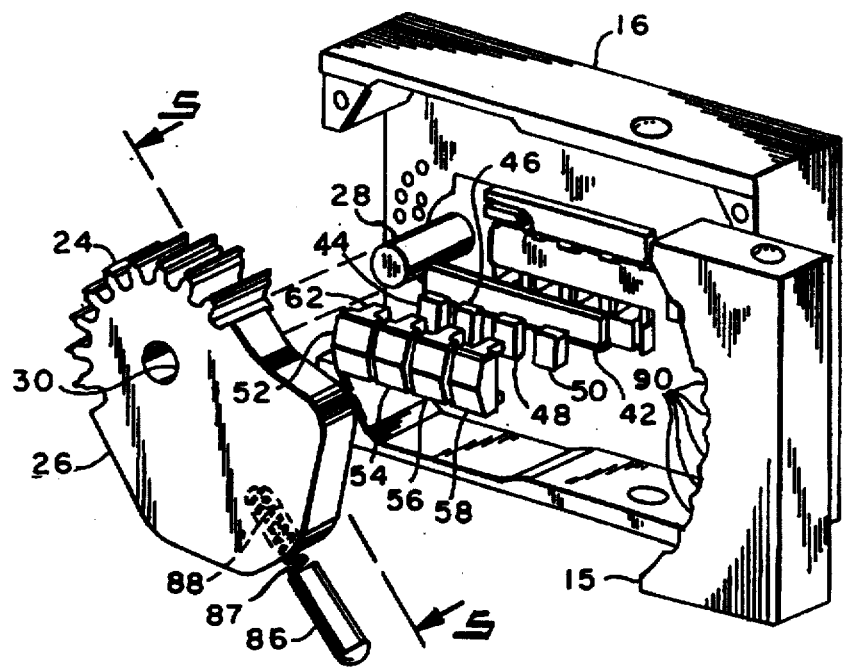
FIG. 4 is an isometric exploded view of a portion of the housing of the assembly of FIG. 1 with portions of the case broken away.

Referring to FIGS. 3 and 4, gear 22 has its teeth meshed with teeth 24 formed on a cam rotor 26 which is journalled for rotation about a post or shaft 28 provided on the housing shell 16 by an aperture 30 formed in the rotor 26.

Referring to FIG. 5, the back or reverse face of rotor 26 is illustrated and has formed thereon a plurality of cam tracks denoted by reference numerals 32, 34, 36, 38 disposed in radially spaced generally concentric arrangement about the center of aperture 30.

Referring to FIG. 4, the housing shell 16 has mounted thereon a ceramic substrate 42 upon which is mounted a plurality of individual capacitive switches as will hereinafter be described in greater detail. Each of the switches has a conductive elastomeric pad disposed thereover as denoted by reference numerals 44, 46, 48, 50. Each of the elastomeric pads has a switch actuator member received thereover as denoted by reference numerals 52, 54, 56, 58 in FIG. 4.

Referring to FIG. 9, one of the actuators 52 is shown in enlarged detail wherein a recess 60 is formed in the undersurface of the actuator for having received therein the conductive elastomeric pad 44 for retention and movement therewith. It will be understood that the actuator 52 illustrated in FIG. 9 is typical also of the actuators 54, 56, 58; and, each of which have a recess such as 60 and a pair of depending projections or guide lugs such as 62, 64 extending therefrom and which are guided for sliding movement in apertures formed in the housing shell 16 as will be hereinafter described in greater detail.

Referring to FIG. 6, the ceramic substrate 42 is illustrated with two of the capacitive switches indicated generally at 66, 68 formed thereon, it being understood that the remaining two switches to be actuated by actuators 54, 56 have been not illustrated for the sake of simplicity. The two typical switches 66, 68 are formed by applying a first layer of conductive ink denoted by reference numeral 70 in FIG. 6 on the substrate 42 and applying thereover dielectric ink to form discrete switch pads 72, 74 for respectively the switches 66, 68. A second layer of conductive ink is disposed in superposed relationship over each of the pads 72, 74 to form discrete conductive portions denoted by reference numerals 76, 78; and, a final layer of dielectric material 80 is disposed thereover in superposed arrangement.

Figure 7:
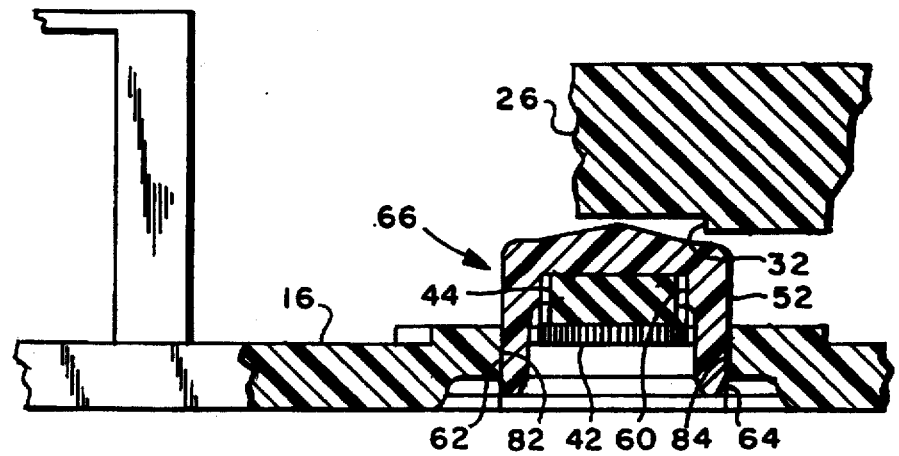
FIG. 7 is an enlarged view of a portion of FIG. 3 showing a typical switch in cross-section in the unactuated condition.

Referring to FIG. 7, the switch 66 as applied to substrate 42 is illustrated with the substrate 42 mounted on housing shell 16 with the elastomeric pad 44 and actuator 52 disposed thereover and in proximity of the rotor 26. It will be understood that the switch as illustrated in FIG. 7 is in the unactuated position wherein cam track 32 of rotor 26 is not in contact with the upper surface of the actuator 52. In the position shown in FIG. 7, the elastomeric pad 44 is not compressed and the capacitive plates 70, 72 of the switch 66 are in the relaxed condition and the switch is thus in the unactuated condition.

Figure 8:
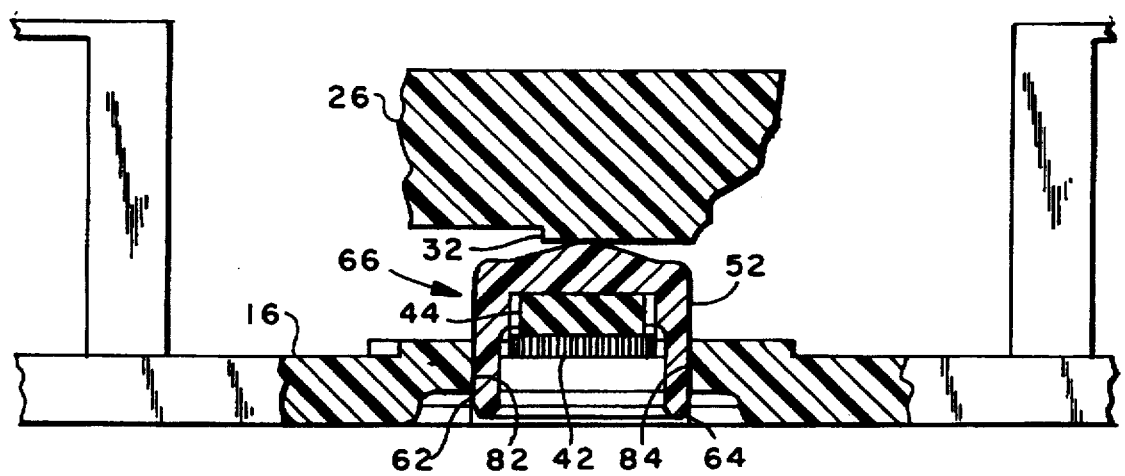
FIG. 8 is a view similar to FIG. 7 showing the switch of FIG. 7 in the actuated condition; and, FIG. 9 is an axonometric view of the actuator for a typical switch of the present invention.

Referring to FIG. 8, the switch 66 is shown in a position wherein rotor 26 has been moved such that cam track 32 has registered in sliding contact against the upper surface of actuator 52 moving the actuator downward compressing the elastomeric pad 44 and causing a change in the capacitance of the switch 66 as electrically detected by external means (not shown). It will be understood that the capacitance as measured between plates 76, 78 is changed by an amount sufficient to be detectable as a change of state or switched condition. It will be noted that any position of the switch illustrated in FIG. 8, the lugs or projections 62, 64 on the actuator 52 have been guided by and moved downwardly within the guide slots 82, 84 formed in the housing shell 16.

In operation, user rotation of the end button 18 on stop 14 causes the rotor 26 to move thereby causing the cam tracks 32, 34, 36, 38 to sequentially move the switch actuators 52, 54, 56, 58 and provide the desired sequence of individual switch actuation for a given rotated position of the rotor 26 a spring 87 received in the bore 88 of rotor 26 biases a plunger or pin 86 slidably received therein outwardly to engage detente surfaces 90 provided in housing portion 15 for providing a detente action to rotation of the rotor about shaft 28. In the present practice of the invention, the switch assembly 10 provides for progressive or gray code sequencing of the movement of switch actuators 52–58 and has found particular application as a windshield wiper motor delay circuit control.

Although the present invention has been described hereinabove with respect to the illustrated embodiments, it will be understood that the invention is capable of modification and variation and is limited only by the scope of the following claims.

We claim:

1. A stalk actuated switch assembly comprising:
    (a) housing means;
    (b) an elongated stalk mounted at the end thereof for pivotal movement about at least one axis on said housing means, said stalks having portions thereof rotatable about an axis extending along the length thereof;
    (c) a cam member disposed on said housing means, said cam member operatively connected for rotary movement upon user rotation of said rotatable portion of said lever;
    (d) a plurality of switches disposed on said housing means, each of said switches having,
        (i) a dielectric substrate having a first coating of conductive ink;
        (ii) a first coating of dielectric ink superposed on a portion of said conductive ink;
        (iii) a second coating of conductive ink superposed on said first coating of dielectric ink;
        (iv) a final coating of dielectric ink superposed on said second coating of conductive ink;
    (e) an actuator member for each of said switches moveable in response to selective movement of said cam member; and,
    (f) a conductive elastomer member disposed on each of said switches to be compressed on said final coating by said movement of said actuator member, said elastomer member effecting a change in capacitance between said first and second coating of conductive ink, said change being sufficiently significant to be detectable electrically as a switching function.

2. The switch assembly defined in claim 1, wherein said rotatable portion of said stalk is operatively engaged with said cam member by meshing of teeth provided on said cam member and said rotatable portion of said stalk.

3. The switch assembly defined in claim 1, wherein said plurality of switches are disposed on spaced aligned arrangement.

4. The switch assembly defined in claim 1, wherein said switches are disposed in spaced linear arrangement and said cam member includes a plurality of spaced concentric cam tracks, with each track disposed for contacting one of said switch actuator members.

5. The switch assembly defined in claim 1, wherein said cam member includes a resiliently biased member slidably disposed thereon; and, said housing means includes detente means engaged by said resiliently biased member upon rotation of said cam member.

6. A stalk actuated switch assembly comprising:
    (a) housing means;
    (b) a stalk member pivoted at an end thereof on said housing means for movement about at least one axis, said stalk member having at least a portion thereof rotatable about another axis normal to said at least one axis;
    (c) a cam member operatively connected to said at least a portion of said stalk member and mounted for rotation thereby on said housing means;

(d) a plurality of switches disposed on said housing means, each of said switches having a moveable actuator and a conductive elastomer member and a pair of spaced conductors forming a capacitor with said elastomer contacting one of said conductors, wherein said cam member is operative selectively to move each of said switch actuator for compressing said elastomer and changing the capacitance of said capacitor for effecting a switching function.

7. The assembly defined in claim 6, wherein said rotatable at least a portion of said stalk member has a first plurality of gear teeth operatively intermeshing second plurality of gear teeth on said cam members.

8. The assembly defined in claim 6, wherein said plurality of switches are disposed in spaced aligned arrangement; and, said cam includes a plurality of spaced concentric cam tracks, with each of said tracks operative to effect movement of one of said moveable actuators.

9. The assembly defined in claim 6, wherein said cam includes a resiliently biased member did ably mounted thereon; and, said housing means includes a plurality of detent surfaces sequentially contacted by said biased member.

10. The assembly defined in claim 6, wherein each of said switches is mounted on a housing shell; and, each of said moveable actuators includes a member having at least one projection extending therefrom, with said projection guided for sliding movement by an aperture in said housing shell.

* * * * *